United States Patent
Fu et al.

(10) Patent No.: US 6,269,315 B1
(45) Date of Patent: Jul. 31, 2001

(54) RELIABILITY TESTING METHOD OF DIELECTRIC THIN FILM

(75) Inventors: Kuan-Yu Fu, Hsinchu; Chuan H. Liu, Taipei; Donald Cheng; Sheng-Hsing Yang, both of Hsinchu; Mu-Chun Wang, Hsinchu Hsien, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/232,202

(22) Filed: Jan. 14, 1999

(51) Int. Cl.$^7$ ................................................. G01R 27/02
(52) U.S. Cl. ................................................ 702/58; 324/551
(58) Field of Search ........................ 702/57, 58; 324/663, 324/551, 677

(56) References Cited

U.S. PATENT DOCUMENTS

| | | | |
|---|---|---|---|
| 5,420,513 | * | 5/1995 | Kimura ................................. 324/551 |
| 5,594,349 | * | 1/1997 | Kimura ................................. 324/551 |
| 5,793,212 | * | 8/1998 | Om ....................................... 324/537 |
| 6,047,243 | * | 4/2000 | Bang et al. ........................... 702/58 |

* cited by examiner

*Primary Examiner*—Arthur T. Grimley
*Assistant Examiner*—John Le
(74) *Attorney, Agent, or Firm*—Thomas, Kayden, Horstemeyer & Risley, LLP

(57) ABSTRACT

A method for testing the reliability of a dielectric thin film. An exponential current ramp test is performed with a delay time to test the dielectric thin film. An exponential current ramp charge-to-breakdown distribution, which is represented by cumulative distribution failure percentage, is obtained. An exponential current ramp charge-to-breakdown at a cumulative distribution failure percentage is calculated. An exponential current ramp constant and a constant current stress constant at the cumulative distribution failure percentage are calculated. A constant current stress charge-to-breakdown at the cumulative distribution failure percentage is calculated by using a specified current density and the constant current stress constant at the cumulative distribution failure percentage. The constant current stress charge-to-breakdown at the cumulative distribution failure percentage is compared to a specified constant current stress charge-to-breakdown to determine the reliability of the dielectric thin film.

12 Claims, 8 Drawing Sheets

RELIABILITY TESTING METHOD OF DIELECTRIC THIN FILM

BACKGROUND OF THE INVENTION

1. Field of the Invention

The present invention relates to a reliability testing method of a dielectric thin film. More particularly, the present invention relates to a method for testing the reliability of a dielectric thin film layer by using an exponential current ramp test (ECR).

2. Description of the Related Art

Reliability of thin dielectric films such as silicon dioxide has been a major concern throughout the history of MOS integrated circuit production. The quality of a gate oxide layer is of great importance, which is particularly true when more stringent customer requirements are demanded. It is essential to monitor oxide performance in production to provide early warning of reliability excursions and provide measures toward continuous process improvement.

It is widely accepted that highly accelerated measurement of gate oxide charge-to-breakdown ($Q_{BD}$) is employed as a process monitor/control parameter. Traditionally, $Q_{BD}$ is determined by using a constant current stress test (CCS). In a CCS test, a stress current density is held constant, and time-to-breakdown ($t_{BD}$) is measured and multiplied by a current density to obtain a $Q_{BD}$. Although the determination of $Q_{BD}$ through CCS is simple and straightforward, the measurement is time consuming. Thus, the application of quick monitoring and improvement of gate oxide layer quality and integrity is limited.

On the other hand, an exponential current ramp test (ECR) provides a fast way to determine the $Q_{BD}$. In an ECR test, a current is injected into the oxide in exponential steps until a breakdown occurs.

The ECR test provides a way of monitoring $Q_{BD}$ in a very short measurement time with reasonable resolution of early failures. Thus, for production monitors, the ECR test has a significant speed advantage over the CCS test. Accordingly, the ECR test should replace the traditional CCS test in industry for fast wafer level reliability (fWLR) of $Q_{BD}$ evaluation as long as it can well correlate with the CCS test.

SUMMARY OF THE INVENTION

Accordingly, the present invention provides a method for testing the reliability of a dielectric thin film with a reduced testing time. The method provides a conversion mechanism between an exponential current ramp test and a constant current stress test.

To achieve these and other advantages and in accordance with the purpose of the invention, as embodied and broadly described herein, the invention provides a method for testing the reliability of a dielectric thin film. An exponential current ramp test is performed with a delay time on a dielectric thin film. An exponential current ramp charge-to-breakdown distribution, which is represented by cumulative distribution failure percentage, is obtained. An exponential current ramp charge-to-breakdown at a cumulative distribution failure percentage is calculated. An exponential current ramp constant and a constant current stress constant at the cumulative distribution failure percentage are calculated. A constant current stress charge-to-breakdown at the cumulative distribution failure percentage is calculated by using a specified current density and the constant current stress constant at the cumulative distribution failure percentage. The constant current stress charge-to-breakdown at the cumulative distribution failure percentage is compared to a specified constant current stress charge-to-breakdown to determine the reliability of the gate oxide layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
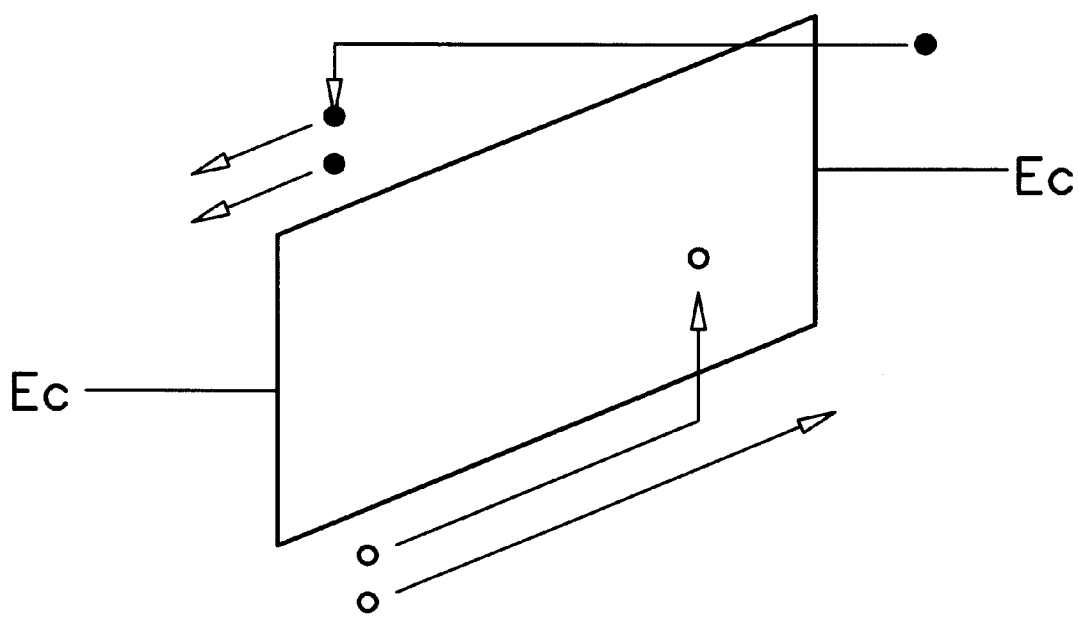
FIG. 1 is a schematic diagram to show the physical model used in the invention.

Reference will now be made in detail to the present preferred embodiments of the invention, examples of which are illustrated in the accompanying drawings. Wherever possible, the same reference numbers are used in the drawings and the description to refer to the same or like parts.

The invention provides a method for testing the reliability of a dielectric then film. As mentioned above, the gate oxide layer plays a crucial role in terms of the quality of a device such as a metal-oxide semiconductor field effect transistor (MOSFET). In the invention, a surface plasmon mode is used to explain the oxide breakdown mechanism. Based on this model, the expression of $Q_{BD}$ for ECR and CCS and their correlation are obtained.

FIG. 1 is a schematic diagram to show the physical model used in the invention.

Referring to FIG. 1, while electrons injected from a cathode to an oxide layer gaining sufficient energy, impact ionization is caused to create electron-hole pairs in the oxide layer. Some of the generated holes are drifted toward the cathode, whereas some are trapped. Hole trapping increases the local field and accelerates a positive charge buildup, and eventually brings the oxide to a destructive breakdown when the hole trapping reaches a critical hole trapping density ($Q_p$).

As mentioned above, ECR is an effective way of obtaining $Q_{BD}$ since data can be acquired within a short test time by increasing the current density (J) exponentially. According to the model, the $Q_{BD,\ ECR}$ for ECR is expressed as:

$$Q_{BD,ECR} = \frac{10^{1/s}}{10^{1/s}-1} J_{BD} t_d \equiv r_0 J_{BD} t_d \quad (1)$$

wherein s is a number of steps per decade of a current density, $J_{BD}$ is current density (in A/cm$^2$) of the last step before breakdown occurs, $t_d$ is delay time in seconds, and $r_0$ is explicitly defined by the equation itself.

The critical hole trapping density $Q_P$ is expressed as $$Q_P = \alpha r_0 J_{BD} t_d \pi \quad (2)$$

wherein $\pi$ is hole trapping coefficient, and $\alpha$ is impact ionization coefficient dependent on an electric field E:

$$\alpha = \alpha_0 e^{-H/E} \quad (3)$$

wherein H is a constant. $J_{BD}$ is also a function of the electric field E:

$$J_{BD} = A_t e^{-B/E} \quad (4)$$

wherein B is constant, and $A_t$ is a general form for Fowler-Nordheim (F–N) tunneling and direct tunneling. The factors $\alpha$ and $A_t$ are also field-dependent, however, their dependence is very weak compared to the exponential term and thus negligible.

By manipulating the equation mentioned above, a concise form for $Q_{BD,\ ECR}$ can be presented by:

$$Q_{BD,\ ECR} = A_{ECR}(t_d)^n \quad (5)$$

Wherein $A_{ECR}$ is exponential current ramp constant and $t_d$ is the delay time. $A_{ECR}$ can be expressed as:

$$A_{ECR} = \left(\frac{Q_P}{\eta \alpha_0}\right)^{\frac{1}{1+m}} (r_0 A_t)^n \quad (6)$$

wherein m is a ratio of H to B, and n is defined as m/(1+m).

From Eq. (5), it is easily to observe that $Q_{BD,\ ECR}$ has a power-law dependence of the delay time $t_d$ with a power index n.

Figure 2A:
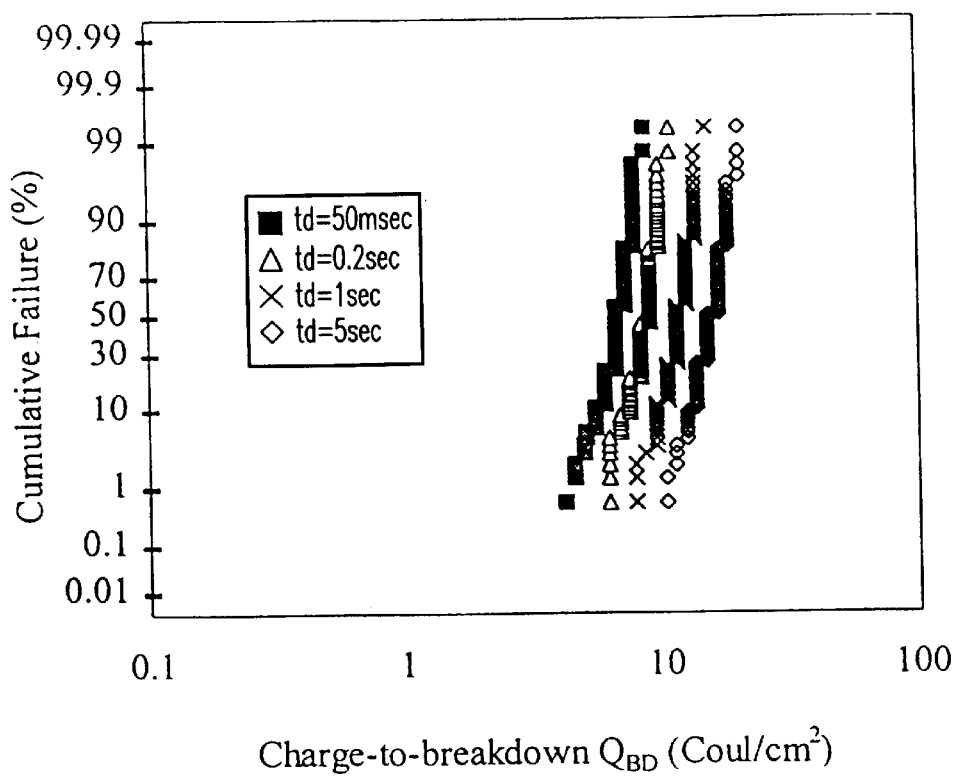
FIG. 2A is a diagram of charge-to-breakdown versus cumulative distribution failure percentage under an exponential current ramp test with positive gate injection for fixed thickness gate oxide layers.
Figure 2B:
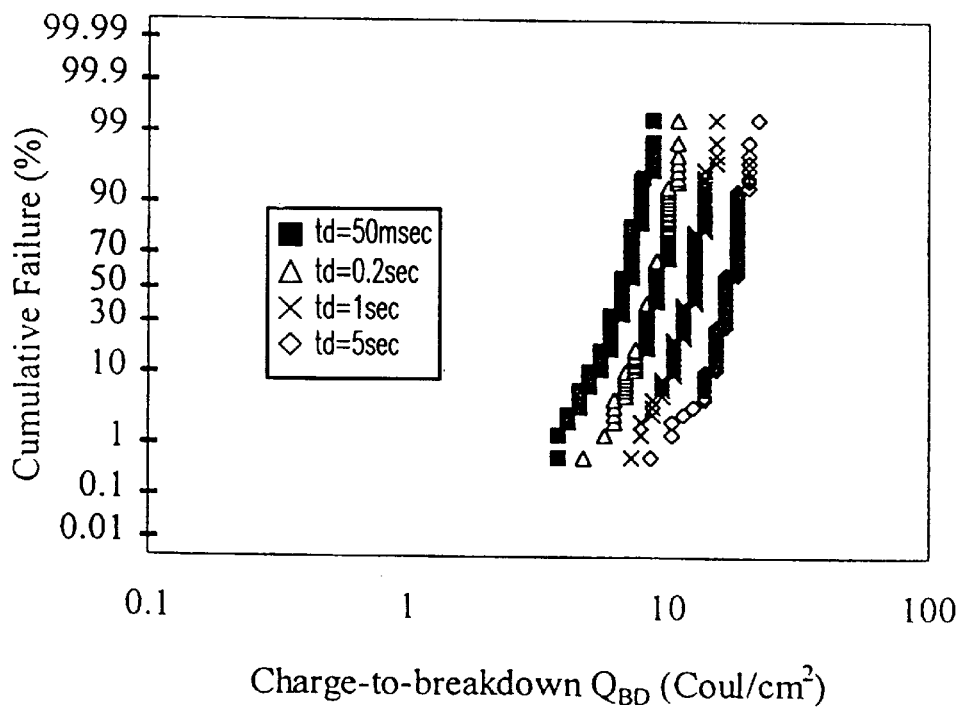
FIG. 2B is a diagram of charge-to-breakdown versus cumulative distribution failure percentage under an exponential current ramp test with negative gate injection for fixed thickness gate oxide layers.

FIG. 2A is a diagram of charge-to-breakdown ($Q_{BD}$) versus cumulative distribution failure (CDF) percentage under an exponential current ramp test with various time delay $t_d$ under a positive gate injection for fixed thickness gate oxide layers. FIG. 2B is a diagram of charge-to-breakdown ($Q_{BD}$) versus cumulative distribution failure (CDF) percentage under an exponential current ramp test with various time delay $t_d$ under a negative gate injection for fixed thickness gate oxide layers.

Referring to FIGS. 2A and 2B, it may be noticed that all curves in FIGS. 2A and 2B are parallel to each other.

Figure 3A:
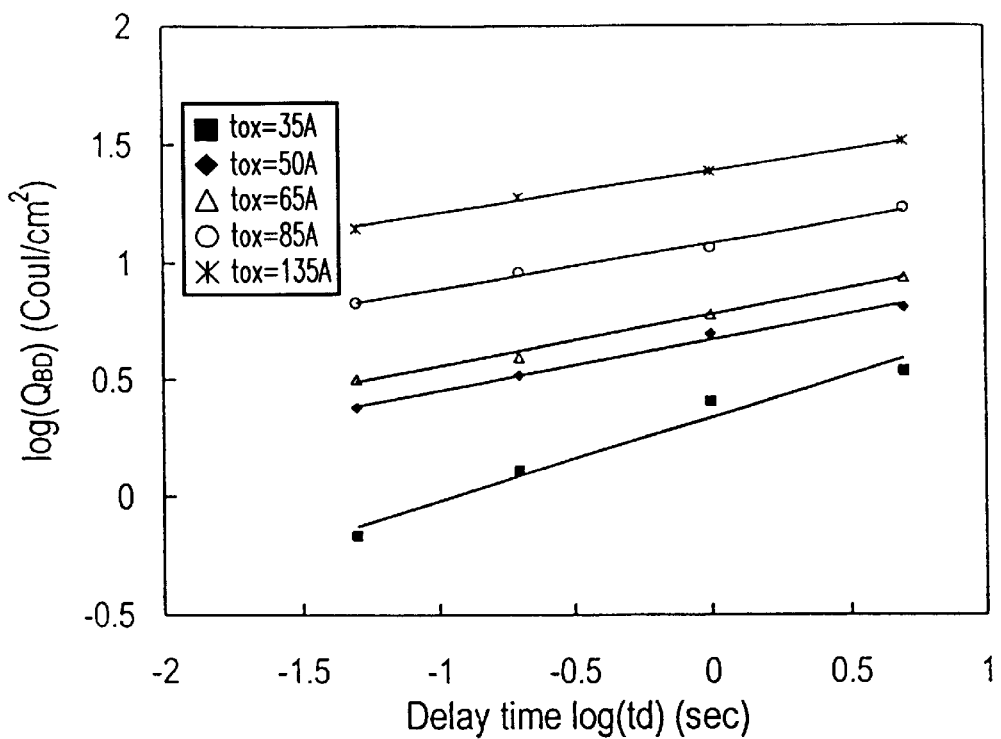
FIG. 3A is a diagram of charge-to-breakdown versus delay time under an exponential current ramp test with positive gate injection for different thickness gate oxide layers.
Figure 3B:
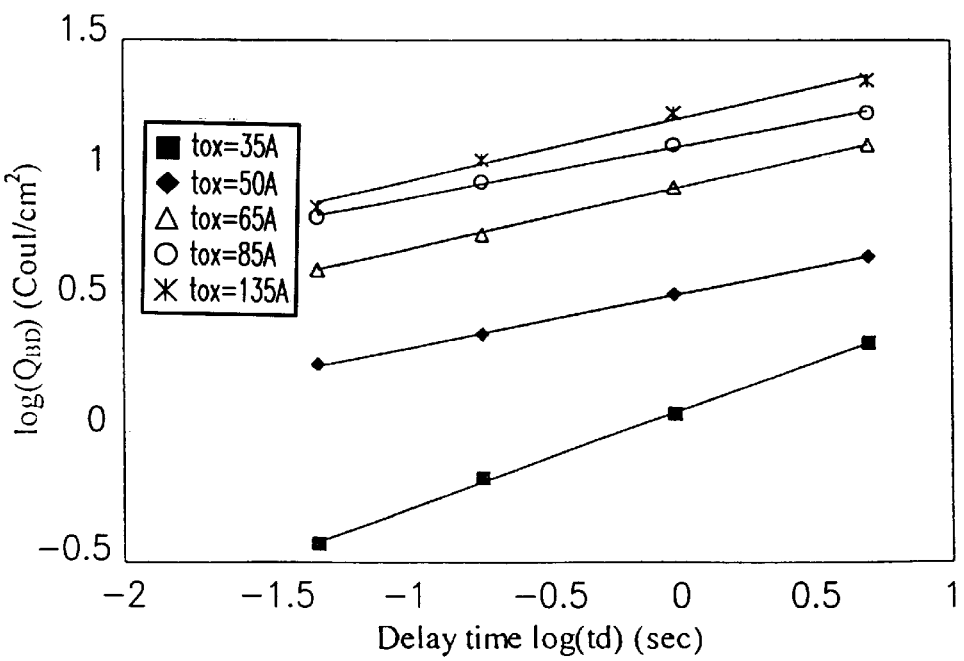
FIG. 3B is a diagram of charge-to-breakdown versus delay time under an exponential current ramp test with negative gate injection for different thickness gate oxide layers.

FIG. 3A is a diagram of charge-to-breakdown $Q_{BD}$ versus delay time $t_d$ under an exponential current ramp test with a positive gate injection for different thickness gate oxide layers. FIG. 3B is a diagram of charge-to-breakdown $Q_{BD}$ versus delay time $t_d$ under an exponential current ramp test with a negative gate injection for different thickness gate oxide layers.

Referring to FIGS. 3A and 3B, the use of $Q_{BD,\ ECR}$ at 50% CDF is perceived due to the parallel shift for all curves in FIGS. 2A and 2B.

The $Q_{BD,\ CCS}$ for CCS is obtained through multiplying the current density J by time-to-breakdown $t_{BD}$. It is presented as $$Q_{BD,\ CCS} = J \cdot t_{BD} \quad (7)$$

By using the same model, a concise form of for $Q_{BD,\ CCS}$ is presented by:

$$Q_{BD,\ CCS} = A_{CCS} \cdot (J)^{-m} \quad (8)$$

Wherein $A_{CCS}$ is constant current stress and J is the current density.

The current stress constant $A_{CCS}$ can be presented by:

$$A_{CCS} = \left(\frac{Q_P}{\eta \alpha_0}\right)(A_t)^m \quad (9)$$

Likewise $Q_{BD,\ ECR}$, $Q_{BD,\ CCS}$ has a power-law dependence of the current density J with a power index m.

Figure 4A:
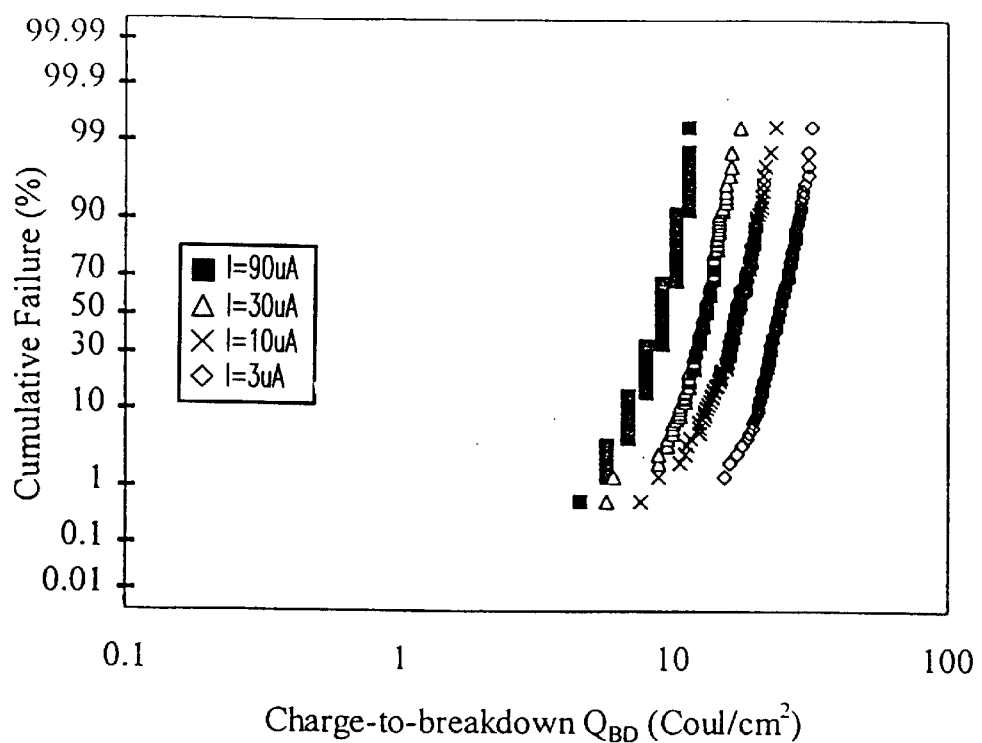
FIG. 4A is a diagram of charge-to-breakdown versus cumulative distribution failure percentage under a constant current stress test with positive gate injection for fixed thickness gate oxide layers.
Figure 4B:
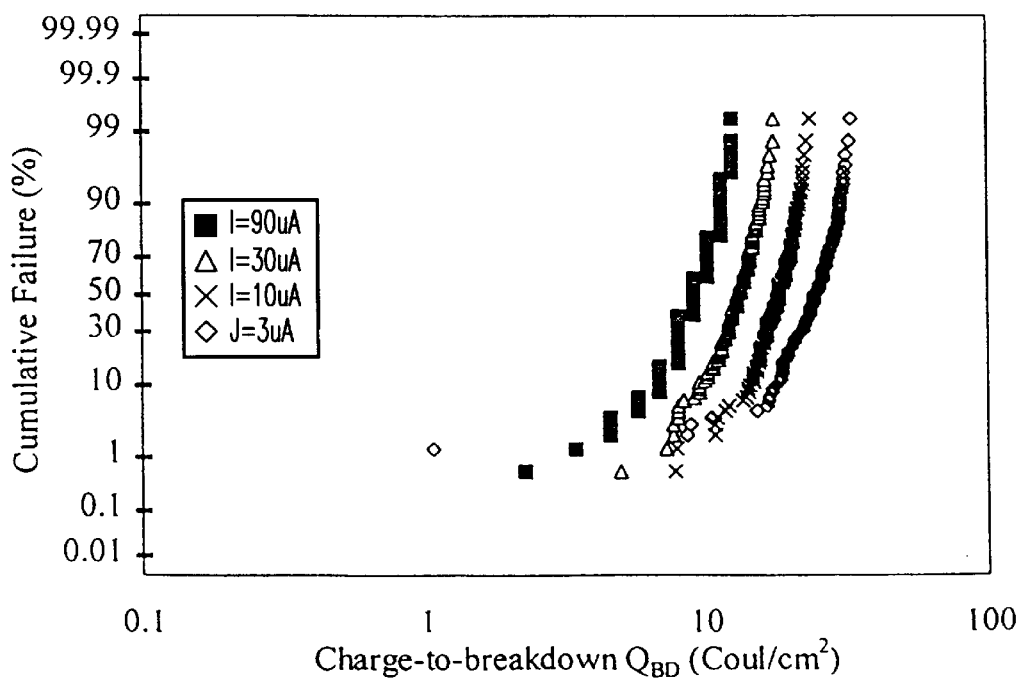
FIG. 4B is a diagram of charge-to-breakdown versus cumulative distribution failure percentage under a constant current stress test with negative gate injection for fixed thickness gate oxide layers.
Figure 5A:
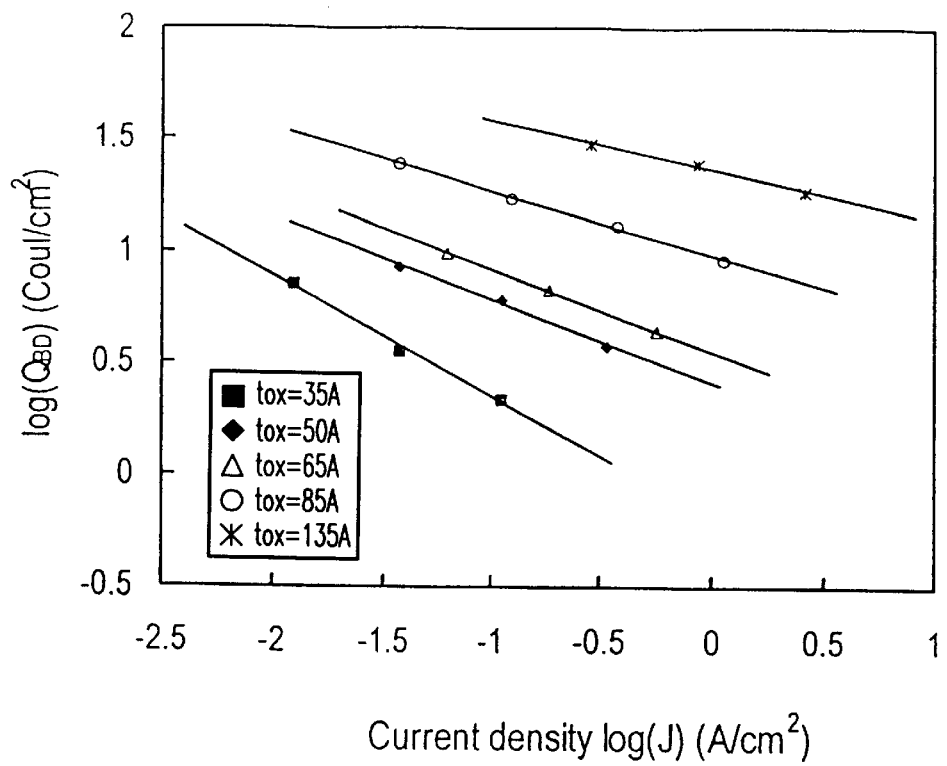
FIG. 5A is a diagram of charge-to-breakdown versus current density under a constant current stress test with positive gate injection for different thickness gate oxide layers.
Figure 5B:
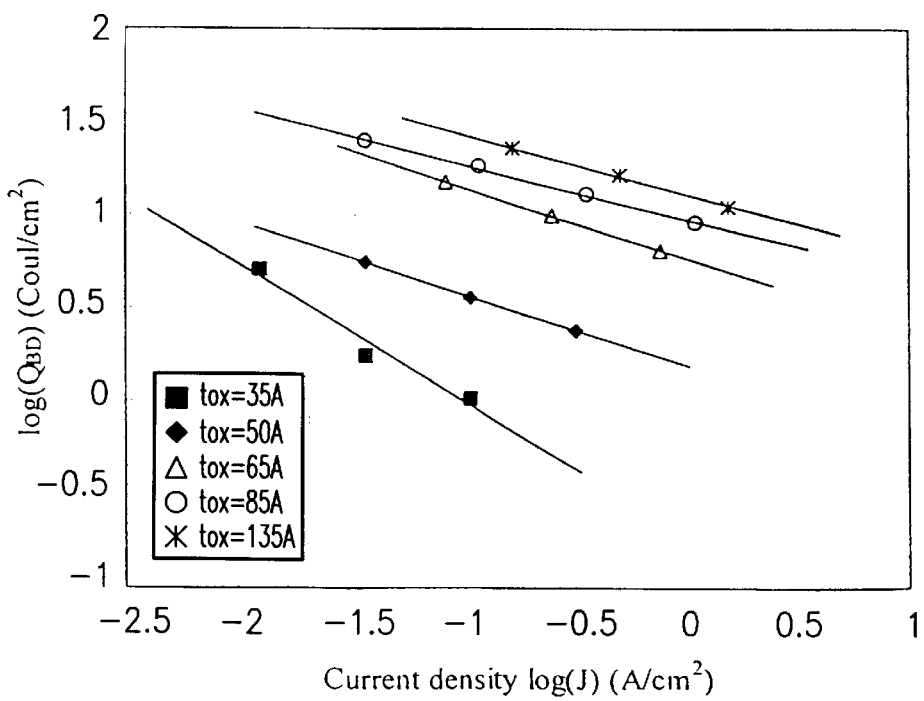
FIG. 5B is a diagram of charge-to-breakdown versus current density under a constant current stress test with negative gate injection for different thickness gate oxide layers.

FIG. 4A is a diagram of charge-to-breakdown $Q_{BD}$ versus cumulative distribution failure CDF percentage under a constant current stress test with a positive gate injection for fixed thickness gate oxide layers. FIG. 4B is a diagram of charge-to-breakdown $Q_{BD}$ versus cumulative distribution failure percentage CDF under a constant current stress test with negative gate injection for fixed thickness gate oxide layers. FIG. 5A is a diagram of charge-to-breakdown versus current density under a constant current stress test with positive gate injection for different thickness gate oxide layers. FIG. 5B is a diagram of charge-to-breakdown $Q_{BD}$ versus current density J under a constant current stress test with a negative gate injection for different thickness gate oxide layers.

Referring to FIGS. 4A and 4B, it is observed that $Q_{BD,\ CCS}$ decreases as J increases. FIGS. 5A and 5B represents the power-law relationship between $Q_{BD,\ CCS}$ and J.

From Eqs. (7) and (9), a relationship of the constant current stress constant $A_{CCS}$ and the exponential current ramp constant $A_{ECR}$ is presented by an equation (10).

$$A_{CCS} = (r_0)^{-m}(A_{ECR}/\xi)^{m-1} \quad (10)$$

Wherein $\xi$ is an empirical factor, so that the empirical factor $\xi$ needs to be pre-characterized each time.

Eqs. (5), (8) and (10) from a conversion mechanism of $Q_{BD}$ between ECR and CCS. In other words, based on this mechanism, $Q_{BD}$ obtained from a test with any stressing condition can be transformed to other with stressing condition specified. Further, this mechanism can be applied to a fWLR method of $Q_{BD}$.

The equations used for the conversion mechanism are summarized as follows:

$$Q_{BD} = A_{ECR}(t_d)^n \quad (11)$$

$$Q_{BD} = A_{CCS}(J)^{-m} \quad (12)$$

Wherein $A_{CCS}$ and m are constant, J is the stress current in CCS and $$n = m/1+m \quad (13)$$

$$A_{CCS} = (r_0)^{-m}(A_{ECR}/\xi)^{m+1} \quad (14)$$

Figure 6:
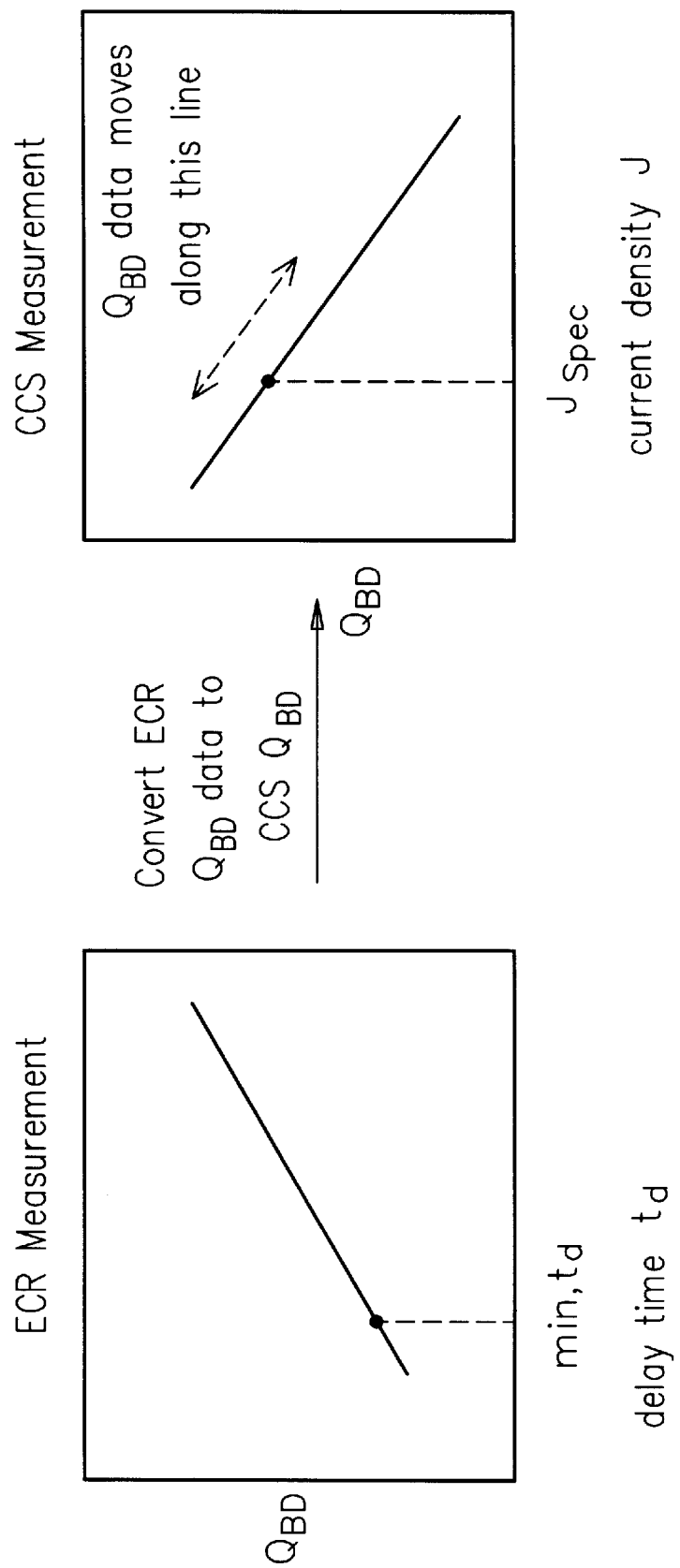
FIG. 6 is a diagram to shown the methodology of the invention to test the reliability of a gate oxide layer.

FIG. 6 is a diagram to show the methodology of the invention to test the reliability of a gate oxide layer.

Referring to FIG. 6, an ECR test is first performed with a small value of $t_d$ to obtain $Q_{BD, ECR}$. $Q_{BD, ECR}$ is converted into $Q_{BD, CCS}$ by using the conversion mechanism at a specified stressing condition ($J_{Spec}$). The converted $Q_{BD, CCS}$ can be compared to industrial specifications that are usually obtained by CCS.

Figure 7:
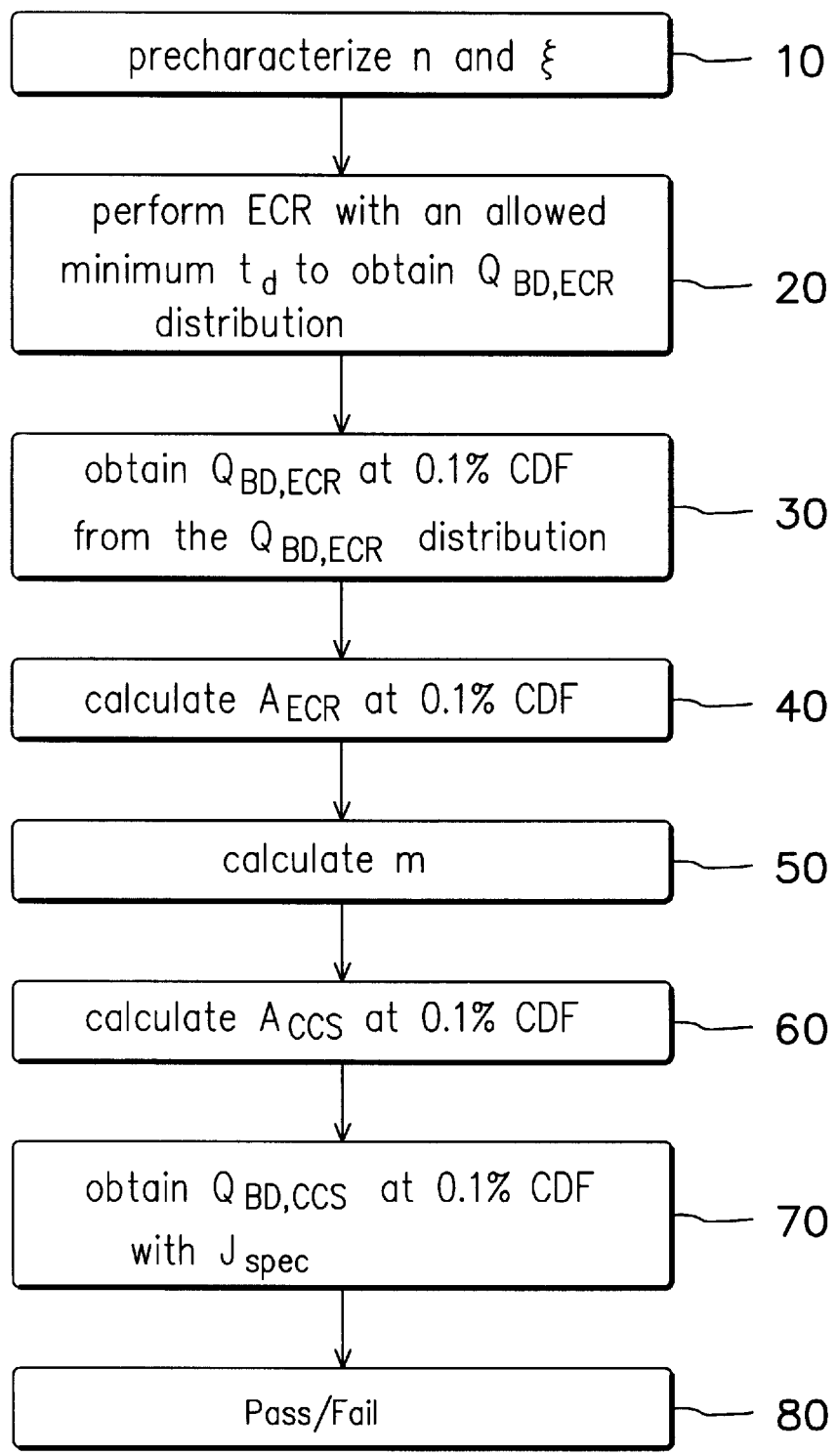
FIG. 7 is a flow diagram showing the procedural steps involved in the method of the invention to test the reliability of a gate oxide layer.

FIG. 7 is a flow diagram showing the procedural steps involved in the method of the invention to test the reliability of a gate oxide layer.

Referring to FIG. 7, at step 10, the constants n and $\xi$ need to be pre-characterized prior to the reliability test of a gate oxide layer because the constants are technology dependent and the same for both n-well and p-well. Only one-time pre-characterization of n and $\xi$ is necessary.

Different values of $t_d$, for example, 50 ms, 200 ms and 1 s, are applied for an ECR test. Preferably, at least three values of $t_d$ are selected. A curve of CDF versus $Q_{BD, ECR}$, of each $t_d$ is obtained. The value of the $Q_{BD, ECR}$ at 50% of the CDF is extracted for each $t_d$. $A_{ECR}$ and n are obtained by linear regression according to Eq. (11). Similar to the ECR test, different values of J, for example, 112.5 mA/cm², 337.5 mA/cm² and 1,0125 A/cm², are applied for a CCS test. Preferably, at least three values of J are selected. Also, a curve of CDF versus $Q_{BD, CCS}$ is obtained. Similarly, the value of $Q_{BD, CCS}$ at 50% CDF is extracted for each J. $A_{CCS}$ and m are obtained by linear regression according to Eq. (12). Eq.(5) is used to calculate $\xi$.

As n and $\xi$ are pre-characterized, the conversion mechanism is ready to use. The reliability test of the gate oxide layer is performed. At step 20, an ECR test is performed by using an allowed minimum value of $t_d$, for example 50 ms. Thus, a relationship between the CDF and the $Q_{BD, ECR}$ is obtained.

Based on the $Q_{BD, ECR}$ distribution, $Q_{BD, ECR}$ at 0.1% of CDF can be obtained at step 30. The $Q_{BD}$ at 0.1% of the CDF is used to check the reliability of the gate oxide layer stipulated in specifications. Since $Q_{BD, ECR}$ at 0.1% CDF is used, the sample size in performing the ECR test should be at least 1000 for the first time.

At step 40, $A_{ECR}$ at 0.1% CDF is obtained by using Eq. (11) and $Q_{BD, ECR}$ at 0.1% of the CDF.

As n is defined as m/(1+m), m is calculated at step 50.

At step 60, since $\xi$, m and $A_{ECR}$ are obtained, $A_{CCS}$ at 0.1% of the CDF can be calculated.

By using Eq. (8), with a specified current $J_{Spec}$, $A_{CCS}$ at 0.1% CDF, $Q_{BD, CCS}$ at 0.1% CDF are obtained at step 70.

At step 80, the converted $Q_{BD, CCS}$ at 0.1% CDF is compared to specifications to determine whether the gate oxide layer passes or fails the reliability test.

Experiments for a 0.25 μm dry-wet-dry (DWD) gate oxide layer is carried out as an example to validate the capability and demonstrate the usage of the test methodology mentioned above.

Figure 8:
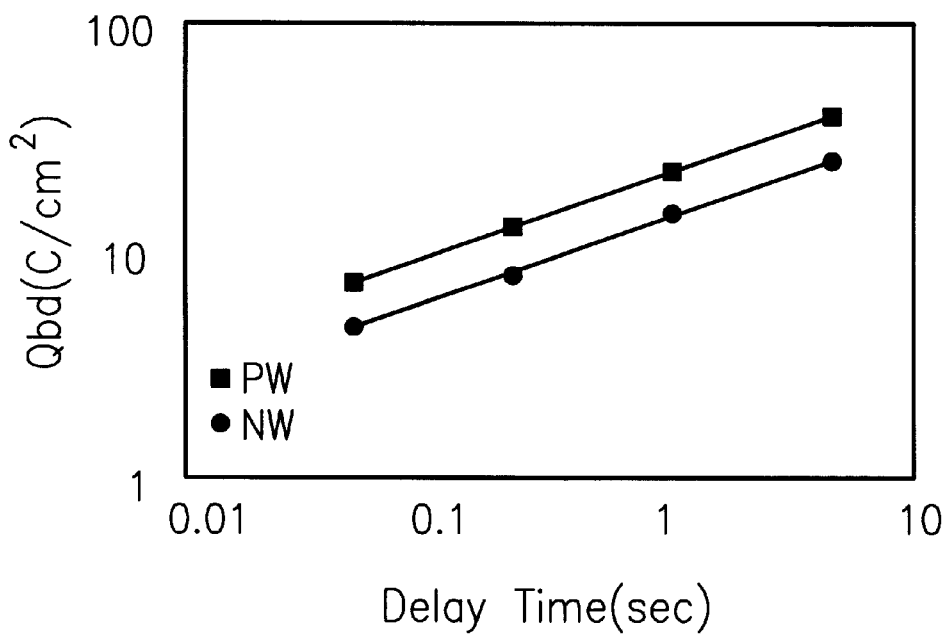
FIG. 8 shows a diagram of charge-to-breakdown versus delay time under an ECR test.
Figure 9:
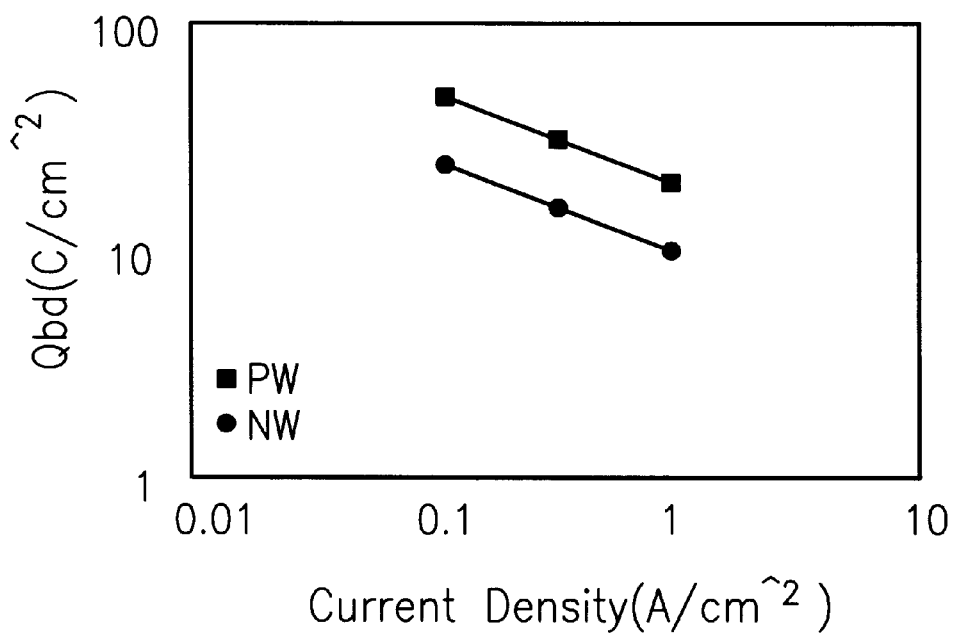
FIG. 9 shows a diagram of charge-to-breakdown versus current density under CCS

According to FIG. 7, the constants n and $\xi$ are pre-characterized. To pre-characterize these two constants, ECR and CCS measurements are performed for four values of $t_d$ (50 ms, 200 ms, 1 s, 5s) and three different values of J (112.5 mA/cm², 337.5 mA/cm², and 1.0125 mA/cm²), respectively. FIG. 8 shows $Q_{BD}$ versus $t_d$ under ECR test, while FIG. 9 shows $Q_{BD}$ versus J under the CCS test. From FIG. 8 and Eq. (11), n is determined to be 0.3 for both p-well and n-well while $A_{ECR}$ (in units of C/cm².sec¹¹) is determined to be 13.38 for p-well and 22.64 for n-well. Similarly, from FIG. 9 and Eq. (12), m is determined to be 0.4 for both p-well and n-well, while $A_{CCS}$ (in units of $C.A^m/c^m2^{m+2}$) is equal to 8.78 per p-well and 16.61 for n-well. Substituting the above parameters into Eq. (14), $\xi$ is calculated to be 1.5.

After the one-time pre-characterizing step, the rest steps shown in FIG. 7 can be performed. The $Q_{BD}$ values for p-well and n-well at a cumulative failure distribution CDF of 0.1% are 2.36 C/cm² and 4.88 C/cm², respectively obtained through ECR with a delay time $t_d$ equal to 50 ms. The value of $A_{ECR}$ at CDF of 0.1% is 5.80 for p-well and 11.99 for n-well by substituting n obtained in the pre-characterizing step into Eq. (11). Similarly, m is equal to 0.43 for both p-well and n-well calculated via Eq. (13). By substituting $\xi$=1.5 into Eq. (14), $A_{CCS}$ is computed to be 2.45 and 6.92 for p-well and n-well, respectively. Using Eq. (12), the CCS $Q_{BD}$ at current density J=0.1 A/cm² is obtained. The resultant $Q_{BD}$ is calculated as 6.58 for p-well and 18.57 for n-well.

Table 1 is a summary of parameters for an exponential current ramp test and a constant current stress test.

|  | negative gate injection | Positive gate injection |
|---|---|---|
| $A_{ECR}$ | 13.38 | 22.64 |
| n | 0.3 | 0.3 |
| $A_{CCS}$(exp.) | 8.78 | 16.61 |
| m(exp.) | 0.4 | 0.4 |
| $\xi$ | 1.5 | 1.5 |
| m(model) | 0.43 | 0.43 |
| $A_{CCS}$(model) | 8.14 | 17.02 |
| Error($A_{CCS}$) | 7.28% | 2.47% |
| Error(m) | 7.5% | 7.5% |

The error of $A_{CCS}$ is obtained by using $$\text{Error}(A_{CCS}) = \frac{A_{CCS}(\text{model}) - A_{CCS}(\text{exp.})}{A_{CCS}(\text{exp.})} \times 100\%,$$

while the error of m is calculated by:

$$\text{Error}(m) = \frac{m(\text{model}) - m(\text{exp.})}{m(\text{exp.})} \times 100\%$$

According to the foregoing, the advantages of the invention include the following:

1. The time of testing the reliability of a gate oxide layer is reduced by performing an exponential current ramp test to test the gate oxide layer.
2. The conversion mechanism involved in the invention can be applied in industry processes such as fast wafer level reliability (fWLR) of charge-to-breakdown.

It will be apparent to those skilled in the art that various modifications and variations can be made to the structure of the present invention without departing from the scope of spirit of the invention. In view of the foregoing, it is intended that the present invention cover modifications and variations of this invention provided they fall within the scope of the following claims and their equivalents.

What is claimed is:

1. A reliability testing method for a dielectric thin film, comprising the steps of:

testing a plurality of dielectric thin films by performing an exponential current ramp test (ECR) with a delay time to obtain an exponential relationship between a current ramp charge-to-breakdown distribution and a cumulative distribution failure percentage (CFD), of each dielectric thin film;

obtaining a value of the charge-to-breakdown distribution $q_{BD,ECR}$ at a specified percentage of cumulative distribution failure (CFD);

calculating a factor $A_{ECR}$ by an equation $Q_{BD,ECR}=A_{ECR}(t_d)^n$, wherein n is a pre-characterized constant;

calculating a factor m by $n=m/(m+1)$;

obtaining a factor $A_{CCS}$ by substituting m into an equation:

$$A_{CCS} = (r_0)^{-m}\left(\frac{A_{ECR}}{\xi}\right)^{m+1},$$

wherein $\xi$ is a pre-characterized constant, and $r_0$ is a factor determined by an increment of the current ramp; and calculating a value of a charge-to-breakdown $Q_{BD,CCS}$ by substituting the value of $A_{CCS}$ into an equation $Q_{BD,CCS}=A_{CCS}(J_{SPEC})^{-m}$ by providing a specified current density $J_{SPEC}$.

2. The method of claim 1, wherein further comprising the step of pre-characterizing n and $\xi$ before the reliability test.

3. The method of claim 2, wherein the step of pre-characterizing n and $\xi$ further comprising:

performing a plurality of exponential current ramp tests on the dielectric thin film with a plurality of different delay time values;

obtaining a charge-to-breakdown value $Q_{BD, ECR(p\%)}$ at a specified percentage p% for each delay time;

calculating an exponential current ramp constant $A_{ECR}$ and the pre-characterized factor n through linear regression method according t an equation $Q_{BD, ECR(p\%)}=A_{ECR}(t_d)^n$;

performing a plurality of constant current stress tests on the dielectric thin film with a plurality of different current density values;

obtaining a charge-to-breakdown value $Q_{BD,CCS(p\%)}$ at a specified percentage p% for each current density value;

calculating a constant current stress constant $A_{CCS}$ and a constant m through linear regression method according to an equation $Q_{BD, CCS(p\%)}=A_{CCS}(J)^m$; and calculating the pre-characterized factor $\xi$ according to the relationship of $$A_{CCS} = (r_0)^{-m}\left(\frac{A_{ECR}}{\xi}\right)^{m+1}.$$

4. A reliability testing method of a dielectric thin film, comprising the steps of:

pre-characterizing constants n and $\xi$;

testing a plurality of dielectric thin films by performing an exponential current ramp test with a minimum allowed delay time $t_d$ to obtain a ECR charge-to-breakdown distribution;

obtaining a value of ECR charge-to-breakdown $Q_{BD, ECR}$ for a failure distribution of 0.1%;

converting the value of ECR charge-to-breakdown $Q_{BD, ECR}$ into a value of CCS charge-to-breakdown $Q_{BD, CCS}$; and comparing the values of the charge-to-breakdown $Q_{BD, CCS}$ to a specification to determine whether each of the dielectric thin film pass or fail.

5. The method of claim 4, wherein the dielectric thing film comprises a gate oxide layer.

6. The method of claim 4, wherein the minimum allowed delay time is about 50 ms.

7. The method of claim 4, wherein the step of pre-characterizing n and $\xi$ further comprising;

performing a plurality of exponential current ramp tests on the dielectric thin film with a plurality of different delay time values;

obtaining a charge-to-breakdown value $Q_{BD, ECR(p\%)}$ at a specified percentage p% for each delay time;

calculating an exponential current ramp constant $A_{ECR}$ and the pre-characterized factor n through linear regression method according to an equation $Q_{BD, ECR(p\%)}=A_{ECR}(t_d)^n$;

performing a plurality of constant current stress tests on the dielectric thin film with a plurality of different current density values;

obtaining a charge-to-breakdown value $Q_{BD, CCS(p\%)}$ at a specified percentage p% for each current density value;

calculating a constant current stress constant $A_{CCS}$ and a constant m through linear regression method according to an equation $Q_{BD, CCS(p\%)}=A_{CCS}(J)^m$; and calculating the pre-characterized factor $\xi$ according to the relationship of $$A_{CCS} = (r_0)^{-m}\left(\frac{A_{ECR}}{\xi}\right)^{m+1}.$$

8. The method of claim 7, wherein the delay time values comprise 50 ms, 200 ms, and 1 s.

9. The method of claim 7, wherein the current density values comprises 112.5 mA/cm$^2$, 337.5 mA/cm$^2$, and 1.0125 A/cm$^2$.

10. The method of claim 7, wherein the percentage p% comprises 50%.

11. The method of claim 4, wherein the value of ECR charge-to-breakdown $Q_{BD, ECR}$ is converted into the value of CCS charge-to-breakdown $Q_{BD, CCS}$ by the following steps;

calculating a factor m, wherein $n=m/(m+1)$;

obtaining a exponential current ramp constant $A_{ECR}$ from a relationship of $Q_{BD, ECR}=A_{ECR}(t_d)^n$;

calculating a constant current stress constant $A_{CCS}$ from the relationship of:

$$A_{CCS} = (r_0)^{-m}\left(\frac{A_{ECR}}{\xi}\right)^{m+1},$$

wherein $r_0$ is a constant determined by an increment of the exponential current ramp; and obtaining the $Q_{BD, CCS}$ from the equation $Q_{BD, CCS}=A_{CCS}(J)^{-m}$ by providing a specified current density J.

12. The method of claim 11, wherein the constant $r_0$ calculated by $r_0=10^{1/s}/(10^{1/s}-1)$ in which s is a number of steps per decade of current density.

* * * * *